(12) United States Patent
Jones

(10) Patent No.: US 7,220,632 B2
(45) Date of Patent: May 22, 2007

(54) METHOD OF FORMING A SEMICONDUCTOR DEVICE AND AN OPTICAL DEVICE AND STRUCTURE THEREOF

(75) Inventor: Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 218 days.

(21) Appl. No.: 11/065,324

(22) Filed: Feb. 24, 2005

(65) Prior Publication Data

US 2006/0189050 A1    Aug. 24, 2006

(51) Int. Cl.
*H01L 21/336*    (2006.01)
*H01L 33/00*    (2006.01)

(52) U.S. Cl. ............. 438/199; 438/229; 438/630; 438/933; 257/E21.13; 257/E21.438; 257/E33.076

(58) Field of Classification Search ........... 438/199, 438/229, 630, 933, FOR. 134, FOR. 291, 438/FOR. 292, FOR. 398; 257/19, 616, 257/E21.438, E21.13
See application file for complete search history.

(56) References Cited

U.S. PATENT DOCUMENTS

| | | | |
|---|---|---|---|
| 6,512,229 | B2 | 1/2003 | Sasaki |
| 6,635,110 | B1 | 10/2003 | Luan et al. |
| 6,784,466 | B2 | 8/2004 | Chu et al. |
| 6,939,814 | B2* | 9/2005 | Chan et al. ............... 438/778 |
| 7,052,946 | B2* | 5/2006 | Chen et al. ............... 438/199 |
| 2004/0180536 | A1* | 9/2004 | Fujiwara et al. ........... 438/633 |

OTHER PUBLICATIONS

Masini, Gianlorenzo et al.; "A germanium photodetector array for the near infrared monolithically integrated with silicon CMOS readout electronics"; Physics E; 2002; pp. 614-619 + cover sheet; vol. 16 (No. 3-4);614-19-2003; Elsevier Science B.V; US.

Masini, Gianlorenzo et al; "Monolithic of near infrared Ge photodetectors with Si complementary metal-oxide-semiconductor readout electronics"; Applied Physics Letters; May 6, 2002; pp. 3268-3270 + cover sheet; vol. 80, No. 18; American Institute of Physics; USA.

Colace,L. et al; "Efficient high-speed near-infrared Ge photodetectors integrated on Si substrates"; Applied Physics Letters; Mar. 6, 2000; pp. 1231-1233; vol. 76, No. 10; American Institute of Physics; USA.

(Continued)

*Primary Examiner*—Matthew Smith
*Assistant Examiner*—Thanh V. Pham
(74) *Attorney, Agent, or Firm*—Kim-Marie Vo

(57) ABSTRACT

An integration process where a first semiconductor protective layer and a second semiconductor protective layer are formed to protect the first and second semiconductor materials, respectfully, during processing to form an optical device, such as a photodetector, and a transistor on the same semiconductor. The first semiconductor protective layer protects the semiconductor substrate during formation of the second semiconductor layer, and the second semiconductor layer protects the second semiconductor material during subsequent processing of the first semiconductor. In one embodiment, the first semiconductor includes silicon and the second semiconductor material includes germanium.

18 Claims, 4 Drawing Sheets

OTHER PUBLICATIONS

Luan, Hsin-Chiao et al; "High-quality Ge epilayers on Si with low threading-disclocation densities"; Applied Physics Letters; Nov. 8, 1999; pp. 2909-2911; vol. 75, No. 19; American Institute of Physics; USA.

Samavedam, S.B. et al.; "High-quality germanium photodiodes integrated on silicon substrates using optimized relaxed graded buffers"; Applied Physics Letters; Oct. 12, 1998; pp. 2125-2127; American Institute of Physics; USA.

Presting, Hartmut; "Near and mid infrared silicon/germanium based photodetection"; Thin Solid Films 321 (1998) 186-195; pp. 186-194; Elsevier Science S.A. USA.

* cited by examiner

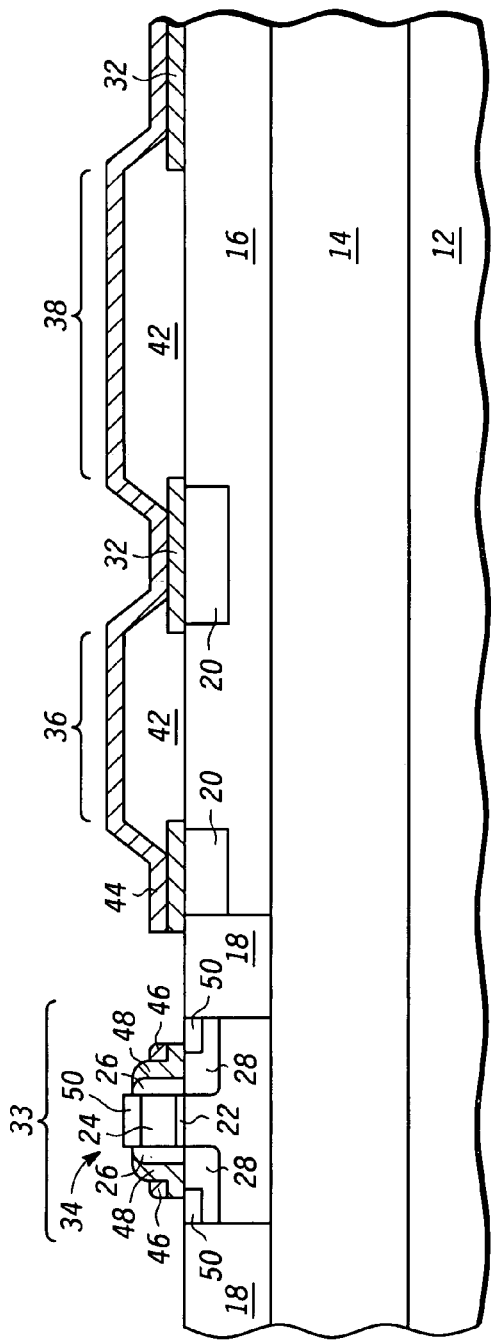
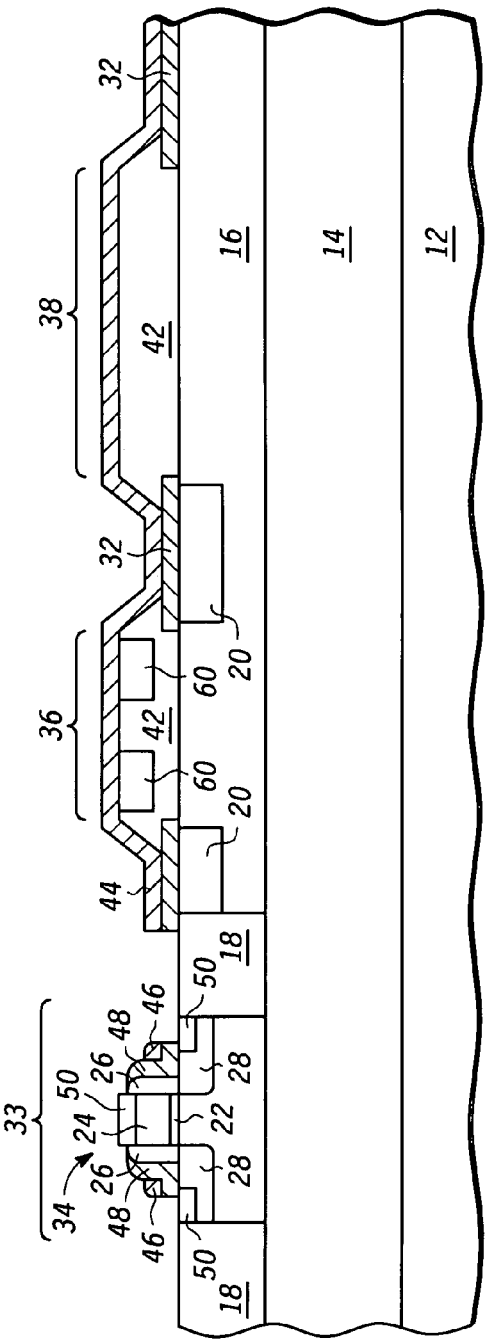

US 7,220,632 B2

METHOD OF FORMING A SEMICONDUCTOR DEVICE AND AN OPTICAL DEVICE AND STRUCTURE THEREOF

FIELD OF THE INVENTION

This invention relates generally to semiconductor devices and optical devices, and more specifically, to the integration of semiconductor devices and optical devices.

BACKGROUND

A continuing object of device performance is to increase the speed of operation. One of the techniques is the use of light as opposed to an electrical signal for the source of information for the device. The optical source needs to be converted to an electrical signal to perform a desired operation, such as controlling a computer. While different chips can be used for the optical and electrical features, it is desirable that the optical and electrical features be integrated onto one chip to decrease costs.

A photodetector is used to convert an optical signal into an electrical signal. Photodetectors can use a semiconductor material as the light absorber. Absorption of a photon can result in creation of electron-hole pairs when the photon energy is greater than the band gap of the semiconductor material. Thus the response of a semiconductor photodetector is dependent on the wavelength of the incident light. For example, the band gap of Si makes it a useful absorber, and hence photodetector, for wavelengths shorter than about 1100 nm. Important wavelengths of light used in optical communications are in bands near 1550 nm. Thus Si is not a useful material for photodetectors for these wavelengths. Ge however has a smaller band gap and can be used as a photodetector for light in both the 1310 and 1550 nm bands. However, Si remains the semiconductor of choice for the vast majority of electronic devices. Thus it would be advantageous to combine Ge photodetectors with Si integrated circuits. Furthermore since Si is transparent at the 1310 and 1550 nm wavelengths, waveguides can be fabricated in a Si chip and combined with Si integrated circuits. However, no integration method exists for forming high-quality crystalline Ge photodetectors and Si transistors on the same substrate. The integration of Ge photodetectors with CMOS integrated circuits is especially of interest because of the wide spread use of CMOS devices. While the fabrication of crystalline Ge photodetectors on Si substrates has been demonstrated, the integration of Ge photodetectors with Si CMOS integrated circuits is difficult because of conflicting materials and thermal requirements for integrating both Ge photodetectors and Si transistors on the same substrate. Therefore a need exists for forming high-quality, crystalline Ge photodetectors and Si transistors on one substrate.

BRIEF DESCRIPTION OF THE DRAWINGS

The present invention is illustrated by way of example and is not limited by the accompanying figures, in which like references indicate similar elements.

FIGS. 2–7 illustrate cross-sections of a workpiece during the formation of optical features and electrical features on one substrate in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
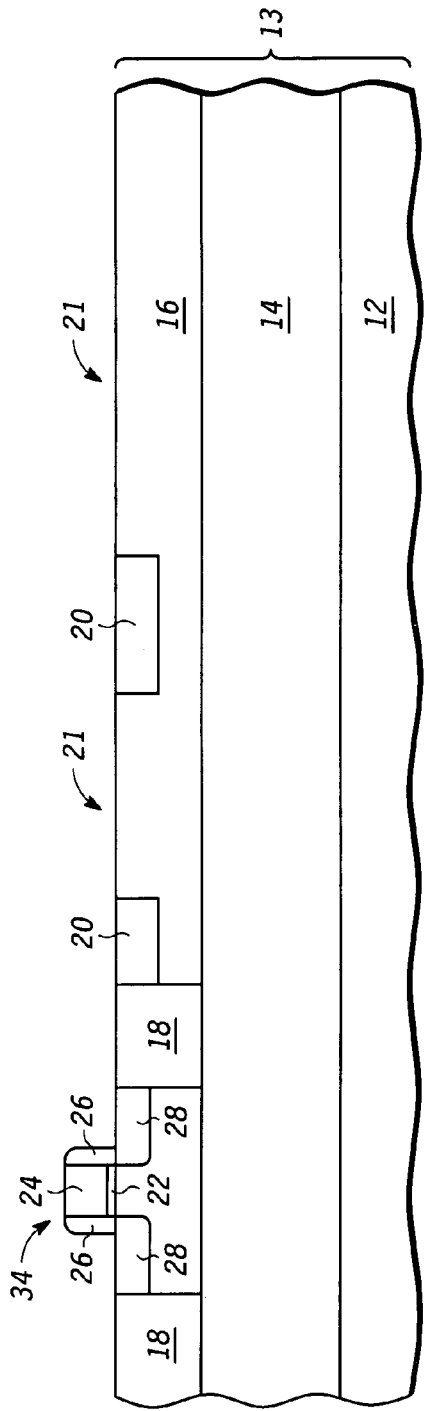
FIG. 1 illustrates a workpiece with isolation regions as known in the prior art.

FIG. 1 illustrates a workpiece 10 having a silicon-on-insulator (SOI) substrate 13 that includes a first silicon layer 12, a buried oxide (BOX) layer 14, and a second silicon layer 16. The first silicon layer 12 is a silicon substrate, the BOX layer 4 is approximately 800 nm of silicon dioxide, and the second silicon layer 16 is approximately 310 nm of silicon. Within the second layer 16 are first shallow trench isolation (STI) regions 18 and second shallow trench isolation (STI) regions 20. The first STI regions 18 extend through the entire second silicon layer 16 and hence are approximately 310 nm in height. The second STI regions 20 are shallower than the first STI regions 18 and are approximately 160 nm in height. Between the first STI regions 18 is a transistor 34 that includes a gate electrode 24, a gate dielectric 22, spacers 26, and source/drain regions 28. The gate electrode 24 may be any conductive material such as polysilicon or a metal gate. The gate dielectric 22 can be any dielectric such as silicon dioxide or a high dielectric constant material, such as hafnium oxide. The spacers 26 may be any insulative material such as silicon nitride. The source/drain regions 28 can be formed using any dopants, such as boron or phosphorus. The first STI regions 18 are used for electrical isolation. Between the second STI regions 20, which are used for optical isolation, are formed rib wave guides 21.

For light in the communications bands at 1310 nm and 1550 nm wavelengths, waveguides can easily be formed in the workpiece 10 because the wave guides can be formed using silicon since Si is transparent at these wavelengths and has a relatively high index of refraction. However, when an optical feature that requires another material to be formed, such as a photodetector which can not be manufactured from silicon, an integration process is needed. An embodiment of the integration process is illustrated in FIGS. 2–7.

Figure 2:
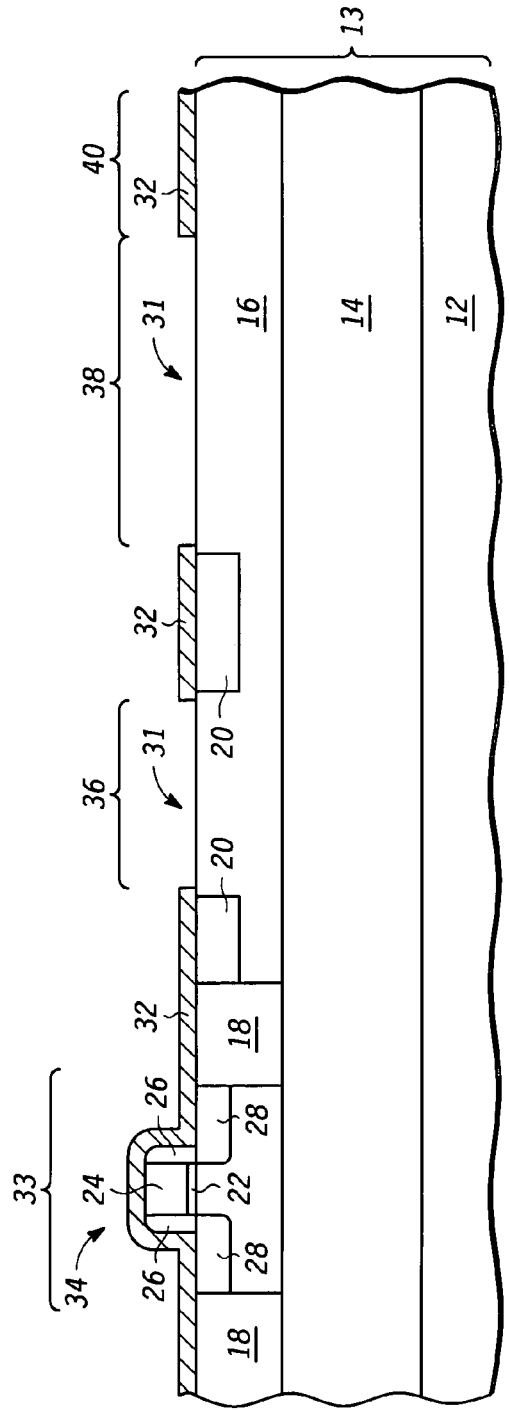

As shown in FIG. 2, the workpiece 30 includes a modified SOI substrate of FIG. 1. In one embodiment, the workpiece 10 can be used to integrate a photodetector with a transistor. However, the substrate does not need to be the SOI substrate 13 of FIG. 1. The SOI substrate is modified to have a transistor region 33, a first photodetector region 36, a second photodetector region 38, and a wave guide region 40. Two photodetector regions and a wave guide region are illustrated, but are not necessary. The two photodetector regions are illustrated as overlying portions of rib wave guides. Alternatively the two photodetectors could overlie portions of the silicon substrate that are not formed as wave guides. The integration discussed is useful whenever a transistor and a photodetector or any optical device that is formed using a semiconductor material that is different than the semiconductor substrate, are being formed on the same substrate; any additional features may be formed as well. The substrate can be any semiconductor material or combinations of materials where at least the upper surface of the substrate includes silicon (e.g., the upper surface of the substrate includes a silicon containing layer). In the embodiment illustrated, the transistor 34 is a metal-oxide-semiconductor (MOS) transistor, but in other embodiments may be any type of transistor such as a HBT transistor, which would not include source/drain regions 28. In the embodiment illustrated, a rib wave guide is already formed in the wave guide region 40. In the photodetector regions 36 and 38, photodetectors will be formed.

After forming the transistor 34 in the transistor region 33, a first semiconductor protective layer 32 is formed and patterned. In other words after forming the gate electrode 24, gate dielectric 22, spacers 26, and source/drain regions 28, if present, of the transistors 34, the first semiconductor protective layer 32 is formed and patterned. The first semiconductor protective layer 32 protects the first semiconductor material, which is the substrate 13. The first semiconductor protective layer 32 may be formed by any suitable process, such as a chemical vapor deposition (CVD), atomic layer deposition (ALD), physical vapor deposition (PVD), the like, and combinations of the above. The first semiconductor protective layer 32 is patterned, using conventional patterning techniques, to expose windows or openings 31. The windows 31 expose the underlying substrate 13. Although not illustrated, there may be dielectric layers under the first semiconductor protective layer 32. The dielectric layers may be spacer and liner dielectrics that are left behind due to the use of a SALBLK layer, which is used to protect regions where it is undesirable to form a self-aligned silicide or salicide. In one embodiment, the spacer is 90 nm of plasma enhanced chemical vapor deposited (PECVD) silicon nitride, and the liner dielectric is 15 nm of PECVD undoped oxide. The SALBLK layer may also used to protect underlying silicon from ion implants. The presence or absence of dielectric layers depends on the particular processing integration being used. If any layers are present under the first semiconductor protective layer 32 in the areas that are to be removed, portions of these underlying layers will also be removed to expose the substrate 13 in the windows 31. A skilled artisan would know how to adjust the etch process to remove any underlying layers. If there are underlying layers present the height of the window 31 will be larger than if the underlying layers were missing. As will be better understood after discussing the second semiconductor formation process, this increase in height will allow the second semiconductor to be grown taller before it grows laterally.

In one embodiment, the first semiconductor protective layer 32 is a silicon protective layer and includes a top layer that is silicon dioxide and a bottom layer of a different material. In one embodiment, the bottom layer includes silicon and nitrogen; for example, the bottom layer may be silicon nitride. In another embodiment, the first semiconductor protective layer 32 only includes one material, such as silicon dioxide. It is desirable that the top layer or the entire silicon protective layer 32 is silicon dioxide if the second material to be formed for the optical device is germanium, because silicon dioxide has good selectivity for the subsequent germanium formation process. In one embodiment, the first semiconductor protective layer is greater than approximately 50 nanometers thick.

Figure 3:
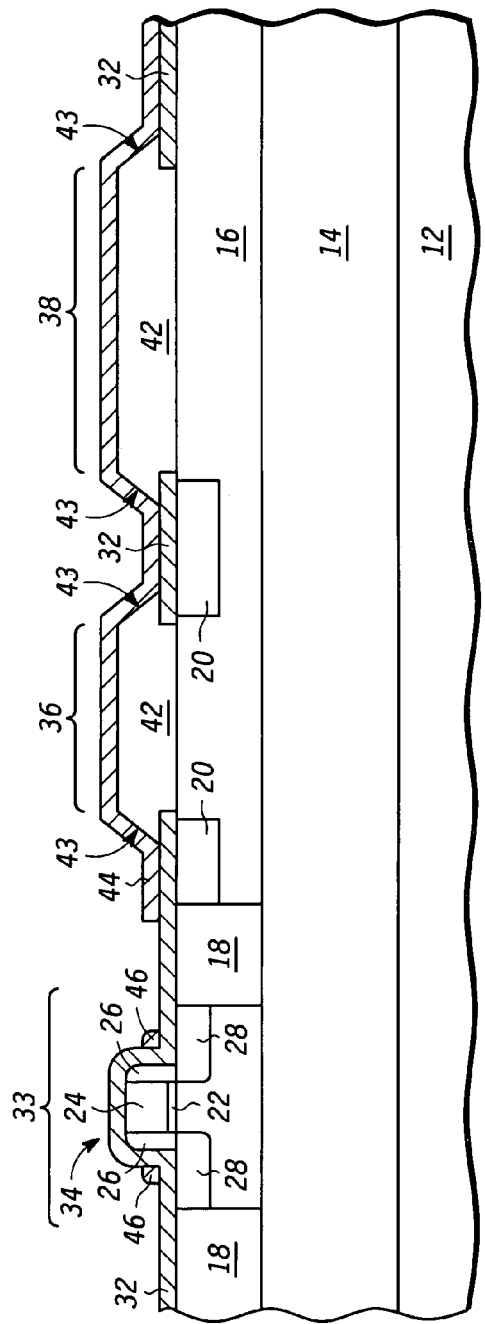

After forming the windows 31 in the first semiconductor protective layer 32, a second semiconductor material 42 is formed in the windows 31 and a second semiconductor protective layer 44 is formed and patterned, as illustrated in FIG. 3. In one embodiment, the second semiconductor material is germanium and the second semiconductor protective layer is a germanium protective layer. This embodiment will be described in more detail. The germanium desirably is formed by selective epitaxial growth in the windows 31. Prior to the germanium growth process, it is desirable to perform a preclean so germanium can be grown better in the windows 31. In one embodiment, the preclean exposes the windows 31 to hydrogen for approximately 5 minutes at approximately 800 degrees Celsius.

After the preclean, a germanium growth process is performed. During the germanium growth process, the first semiconductor protective layer 32 prevents germanium growth on the other areas of the workpiece 30. Hence, as described above, it is desirable that the first semiconductor protective layer 32 be as selective to germanium growth as possible to improve its performance as protecting the otherwise exposed areas that include silicon from germanium growth. In one embodiment, the germanium is grown by exposing the workpiece 30 to a GeH$_4$ species at a temperature of approximately 400 to 600 degrees Celsius. During the germanium growth process the germanium will grow epitaxially within the thickness of the window 31 or overgrow this thickness. If the germanium overgrows the thickness of the window 31, then it may also grow laterally over the silicon protective layer 32 and form facets 43, as shown in FIG. 3. The shape of the facets 43 will depend on factors, such as the crystal orientation of the second layer 16, the orientation of the window 31 relative to the crystal structure of the second layer 16, and the germanium growth conditions. In the embodiment shown in the figures, the facets 45 are illustrated as having a 45 degree slant but the actual facet shape will depend on the factors noted. Because in the preferred integration process, the anneal temperature for the source/drain regions 28 are greater than the melting temperature of germanium, the anneal should be done before germanium formation.

After forming the second semiconductor material 42 in the windows 31, the second semiconductor protective layer 44 is formed and patterned. Since it is undesirable for the second semiconductor material (and the rib wave guide) to react with the silicide forming metal during the subsequent salicide process, the second semiconductor protective layer 44 is formed and patterned to leave over the second semiconductor material. In addition, in one embodiment, the SALBLK may be left over the rib wave guide and hence, the second semiconductor protective layer 44 can be removed in the area protected by the SALBLK, if desired.

The second semiconductor protective layer 44 can be formed by any process such as CVD, ALD, PVD, the like, and combinations of the above. In one embodiment, the second semiconductor protective layer 44 is a germanium protective layer that includes silicon and nitrogen, such as silicon nitride, silicon-rich silicon nitride, or silicon oxynitride. In one embodiment, the germanium protective layer 44 is approximately 50 to 80 nanometers thick. The second semiconductor protective layer 44 is patterned using conventional patterning techniques to remove the second semiconductor protective layer 44 from at least portions of the transistor region 33 and expose the first semiconductor protective layer 32 in the transistor region 33. As will be better understood after further discussion of the process, the second semiconductor protective layer 44 only needs to be removed from areas in the transistor region 33 where salicidation is to be performed. However, the second semiconductor protective layer 44 also only needs to remain over the second semiconductor material to protect it during the salidication process. As shown in FIG. 3, even if the second semiconductor protective layer 44 is being removed in the entire transistor region 33, portions of the germanium protective layer 44 may remain as spacers 46 due to the limitations of the etch process.

Figure 4:
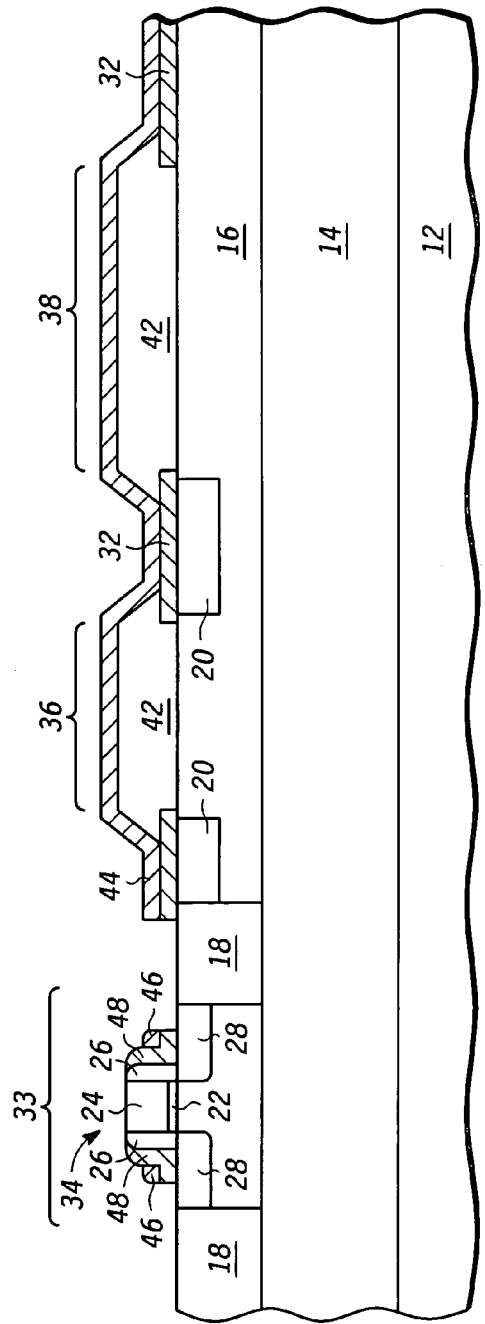

After removing the second semiconductor protective layer 44 from the desired areas, the first semiconductor protective layer 32 is removed in the desired areas. As shown in FIG. 4, the first and second semiconductor protective layers 32 and 44 are removed in almost all portions of the transistor region 33. Like the second semiconductor protective layer 44, portions of the first semiconductor protective layer 32 may not be removed from under the spacers 46 and adjacent the spacers 26, resulting in spacers 48. In addition, the first semiconductor protective layer 32 only needs to be removed over portions of the transistor region 33 that are going to be salicided. In the preferred embodiment the entire transistor region 33 is exposed to an etching chemistry with a high degree of anisotropy. The anisotropic etch chemistry is used to prevent the undesired removal of the spacers 26. However, the first and second protective layers 32 and 44 are relatively thin, and the etch process may be tailored to provide less than total anisotropy. Thus the resulting spacers 46 and 48 may be formed to be quite small while still protecting the spacers 26.

As shown in FIG. 5 after removing portions of the first semiconductor protective layer 32, the exposed portions that include silicon are salicided. In the embodiment illustrated in FIG. 5 the gate electrode 24 and the source/drain regions 28 include silicon and hence will be salicided to form salicide 50. In one embodiment, to form the salicide 50, a metal, such as cobalt, is deposited using CVD, ALD, PVD, the like or combinations of the above like at a temperature of less than approximately 400 degrees Celsius and at a thickness of approximately 10 nm. The structure is then heated at a temperature within approximately 600–800 degrees Celsius, or in one embodiment approximately 695 degrees Celsius, in order for the cobalt to react with silicon in the gate electrode 24 and the source/drain regions 28.

In one embodiment after forming the salicide 50, an implant and anneal is performed to form doped regions 60 in a portion of the germanium 42, as shown in FIG. 6. One doped region 60 will be doped N+ and the other P+. Therefore, two mask and implant process will be needed. However, one anneal can be performed after the implant of both the N-type and P-type species or an anneal can be used following the individual implantation of the N-type and P-type species. In one embodiment, the N-type species is annealed at a temperature between approximately 500 to 600 degrees Celsius, or more specifically 550 to 600 degrees Celsius, and the P-type species is annealed at a temperature between approximately 400 to 600 degrees Celsius. There is more latitude in the annealing temperature for the P-type species in Ge than for the N-type species since the P-type species is relatively easy to activate and does not diffuse as much as the N-type species. If only one anneal is being performed to anneal both the N-type and P-type species than a temperature between approximately 500 to 600 degrees can be used.

When using cobalt it is desirable to first form the salicide 50 and then form the doped regions 60 in the second semiconductor material 42, as described above. This process sequence is desirable because the temperature used to form a salicide when using cobalt is too hot for the dopants in germanium and will cause excessive dopant diffusion. However, if nickel is used instead of cobalt the doped regions 60 should be formed prior to the salicide 50 because the nickel salicide formation temperatures and temperatures for thermal stability are lower than the anneal temperature of the dopants in germanium.

Figure 7:
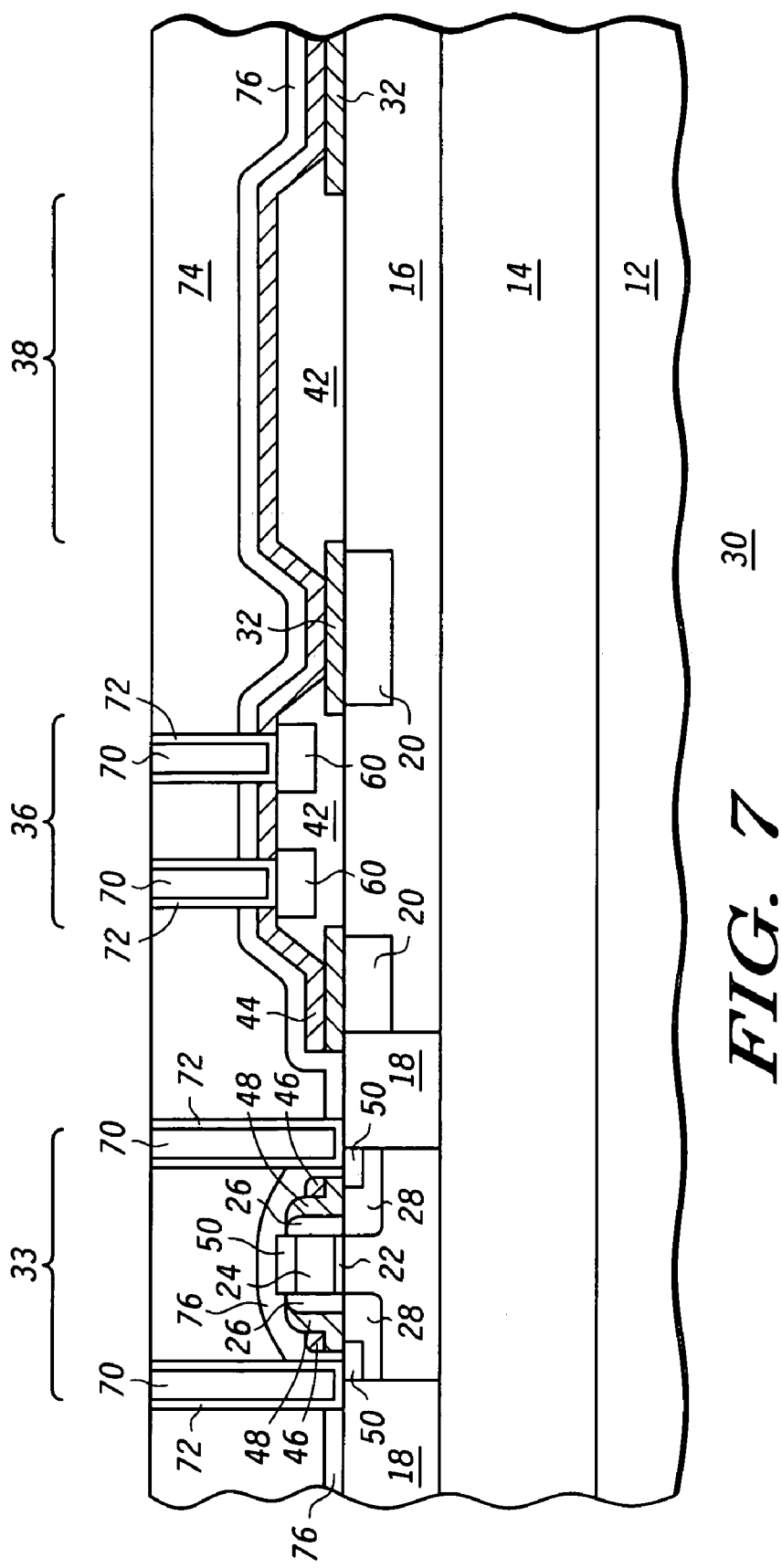

After forming the doped regions 60, an etch stop layer 76, an interlevel dielectric (ILD) layer 74, contacts 70, and liners 72 are formed, as shown in FIG. 7. The etch stop layer 76 serves as an etch stop for etching the contacts 70. In one embodiment, the etch stop layer 76 is silicon nitride formed by CVD, ALD, PVD, the like or combinations of the above. After forming the etch stop layer 76, the ILD layer 74 is formed over the etch stop layer 76 by CVD, ALD, PVD, the like, and combinations of the above. The ILD layer 74 may be planarized using chemical mechanical polishing (CMP) or other planarization technique. After forming the ILD layer 74, contact openings are etched in the ILD layer 74 using the etch stop layer 76. After forming the contact openings, the liners 72 and contacts 70 are formed in the contact openings. The liners 72 can be any suitable material, such as tantalum nitride, formed by any process, such as electroplating, CVD, ALD, PVD, the like and combinations of the above. The contacts 70 may be any conductive material, such as copper or aluminum, formed by electroplating, CVD, ALD, PVD, the like and combinations of the above.

In one embodiment, an optoelectronic device is formed by the method that includes providing a substrate including a first semiconductor, wherein the substrate has a first region and a second region and the first semiconductor includes silicon, forming a gate dielectric over the substrate in the first region, forming a gate electrode over the gate dielectric, forming a first semiconductor protective layer over the first region and the second region after forming the gate electrode, removing portions of the first semiconductor protective layer in the second region to form openings, forming a second semiconductor in the openings, wherein the second semiconductor includes germanium, forming a second semiconductor protective layer over the second semiconductor in the second region, patterning the first semiconductor protective layer in the first region to expose an area, and forming a contact that is coupled to the area. In one embodiment, forming the first semiconductor protective layer is performed after forming source/drain regions of the transistor. In one embodiment, forming the first semiconductor protective layer includes forming the first semiconductor protective layer including a dielectric. In one embodiment, the second semiconductor protective layer includes silicon and nitrogen. In one embodiment, forming the first semiconductor protective layer includes forming silicon dioxide. In one embodiment, forming the second semiconductor in the windows includes selectively depositing epitaxial germanium. In one embodiment, the method includes saliciding the area prior to forming the contact, implanting the second semiconductor material with a dopant, annealing the material after the implanting, and wherein the annealing is performed after the saliciding the area. In one embodiment, the method includes implanting the second semiconductor with a dopant, annealing the material after the implanting, and wherein the annealing is performed before saliciding the area. In one embodiment, forming the silicon protective layer includes depositing the silicon protective layer.

In one embodiment, a method for forming an optoelectronic device includes providing a substrate including silicon, forming a transistor on the substrate, forming a silicon protective layer over the substrate after forming the transistor, exposing portions of the substrate, wherein the exposing includes forming windows in the silicon protective layer, forming a material including germanium in the windows, forming a germanium protective layer over the substrate, patterning the germanium protective layer and the silicon protective layer to expose an area including silicon, and saliciding the area. In one embodiment, forming the silicon protective layer is performed after forming source/drain regions of the transistor. In one embodiment, forming the silicon protective layer includes forming the silicon protective layer including a dielectric. In one embodiment, forming the silicon protective layer includes forming silicon dioxide. In one embodiment, forming the material including germanium in the windows includes selectively depositing epitaxial germanium. In one embodiment, the method includes implanting the material including germanium with a dopant, annealing the material after the implanting, and wherein the annealing is performed after the saliciding the area. In one embodiment, the method includes implanting the material including germanium with a dopant, annealing the material after the implanting, and wherein the annealing is performed before the saliciding the area. In one embodiment, the germanium protective layer includes silicon and nitrogen. In one embodiment, the substrate is a silicon-on-insulator (SOI) substrate.

In one embodiment, a device includes a semiconductor substrate including silicon, a first region, and a second region, a photodetector including germanium over the first region, a transistor over the second region, and a germanium protective layer over the photodetector, but not over the transistor. In one embodiment, the device includes a dielectric formed over the transistor and the photodetector, a first contact formed within the dielectric, wherein the first contact is coupled to the photodetector, and a second contact formed within the dielectric, wherein the second contact is coupled to the transistor. In one embodiment, the device includes a silicon protective layer under the germanium protective layer.

By now it should be appreciated that there has been provided optical features and electrical features on the same substrate. In the embodiment shown in FIG. 7, an optical wave comes in from the right through the rib wave guide and is then converted into an electrical signal by a photodetector. While not illustrated, the photodetector can receive the optical signal from a normal incidence without the presence of a wave guide.

Furthermore, one should appreciate that in the embodiment where the first semiconductor material includes silicon and the second semiconductor material includes germanium, that because the anneal temperature for the source drain region is greater than the melting temperature of germanium, the annealing of these regions should be done before germanium formation. And because the temperature for the preclean is too high for thermal stability of the salicide formed in the subsequent salicidation process, the germanium formation process is performed before this salicidation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the second semiconductor material can be formed by any suitable process. Also, other optical devices may be formed. As explained above, the order of some of the process, such as salicidation and implantation of the second semiconductor material, may depend on the material used for the salicidation process. Any suitable material can be used for the salicidation process. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

What is claimed is:

1. A method comprising:
   providing a substrate comprising a first semiconductor material, wherein the substrate has a first region and a second region and the first semiconductor material comprises silicon;
   forming a gate dielectric over the substrate in the first region;
   forming a gate electrode over the gate dielectric;
   forming a first semiconductor protective layer over the first region and the second region after forming the gate electrode;
   removing portions of the first semiconductor protective layer in the second region to form openings;
   forming a second semiconductor material in the openings, wherein the second semiconductor comprises germanium;
   forming a second semiconductor protective layer over the second semiconductor in the second region;
   patterning the first semiconductor protective layer in the first region to expose an area; and
   forming a contact that is coupled to the area.

2. The method of claim 1, wherein the forming the first semiconductor protective layer is performed after forming source/drain regions of a transistor.

3. The method of claim 1, wherein the forming the first semiconductor protective layer comprises forming the first semiconductor protective layer comprising a dielectric.

4. The method of claim 1, wherein the second semiconductor protective layer comprises silicon and nitrogen.

5. The method of claim 1, wherein the forming the first semiconductor protective layer comprises forming silicon dioxide.

6. The method of claim 1, wherein the forming the second semiconductor in the openings comprises selectively depositing epitaxial germanium.

7. The method of claim 1, further comprising saliciding the area prior to forming the contact, implanting the second semiconductor material with a dopant, annealing the second semiconductor material after the implanting, and wherein the annealing is performed after the saliciding the area.

8. The method of claim 1, further comprising implanting the second semiconductor with a dopant, annealing the second semiconductor material after the implanting, and wherein the annealing is performed before saliciding the area.

9. The method of claim 1, wherein the forming the first semiconductor protective layer comprises depositing the first semiconductor protective layer.

10. A method comprising:
   providing a substrate comprising silicon;
   forming a transistor on the substrate;
   forming a silicon protective layer over the substrate after forming the transistor;
   exposing portions of the substrate, wherein the exposing comprises forming windows in the silicon protective layer;
   forming a material comprising germanium in the windows;
   forming a germanium protective layer over the substrate;
   patterning the germanium protective layer and the silicon protective layer to expose an area comprising silicon; and
   saliciding the area.

11. The method of claim 10, wherein the forming the silicon protective layer is performed after forming source/drain regions of the transistor.

12. The method of claim 10, wherein the forming the silicon protective layer comprises forming the silicon protective layer comprising a dielectric.

13. The method of claim 12, wherein the forming the silicon protective layer comprises forming silicon dioxide.

14. The method of claim 10, wherein the forming the material comprising germanium in the windows comprises selectively depositing epitaxial germanium.

15. The method of claim 10, further comprising implanting the material comprising germanium with a dopant, annealing the material after the implanting, and wherein the annealing is performed after the saliciding the area.

16. The method of claim 10, further comprising implanting the material comprising germanium with a dopant, annealing the material after the implanting, and wherein the annealing is performed before the saliciding the area.

17. The method of claim 10 wherein the germanium protective layer comprises silicon and nitrogen.

18. The method of claim 10 wherein the substrate is a silicon-on-insulator (SOI) substrate.

* * * * *